(12) United States Patent
Nakata

(10) Patent No.: US 7,994,601 B2
(45) Date of Patent: Aug. 9, 2011

(54) SEMICONDUCTOR LIGHT RECEIVING DEVICE

(75) Inventor: Takeshi Nakata, Tokyo (JP)

(73) Assignee: NEC Corporation, Tokyo (JP)

( * ) Notice: Subject to any disclaimer, the term of this patent is extended or adjusted under 35 U.S.C. 154(b) by 261 days.

(21) Appl. No.: 12/162,640

(22) PCT Filed: Jan. 26, 2007

(86) PCT No.: PCT/JP2007/051313
§ 371 (c)(1),
(2), (4) Date: Jul. 30, 2008

(87) PCT Pub. No.: WO2007/086528
PCT Pub. Date: Aug. 2, 2007

(65) Prior Publication Data
US 2009/0039453 A1 Feb. 12, 2009

(30) Foreign Application Priority Data
Jan. 30, 2006 (JP) ................................ 2006-021399

(51) Int. Cl.
*H01L 31/07* (2006.01)
(52) U.S. Cl. .................... 257/438; 257/431; 257/436
(58) Field of Classification Search .................. 257/431, 257/436, 438
See application file for complete search history.

(56) References Cited

U.S. PATENT DOCUMENTS

| 6,350,998 B1* | 2/2002 | Tsuji ............................. 257/186 |
| 2006/0017129 A1* | 1/2006 | Nakaji et al. .................. 257/438 |
| 2006/0202297 A1* | 9/2006 | Ishimura ....................... 257/436 |

FOREIGN PATENT DOCUMENTS

| JP | 02-065279 | 3/1990 |
| JP | 06-061521 | 3/1994 |
| JP | 2762939 | 3/1998 |
| JP | 2001-028454 | 1/2001 |
| JP | 2004-111763 | 4/2004 |

OTHER PUBLICATIONS

I. Watanabe et al., "A New Planar-Structure InAlGaAs-InAlAs Superlattice Avalance Photodiode with a Ti-Implanted Guard-Ring", IEEE Photonics Technology Letters, vol. 8, No. 6, 1996.

* cited by examiner

Primary Examiner — Marcos D Pizarro
Assistant Examiner — Tifney L Skyles
(74) Attorney, Agent, or Firm — Young & Thompson

(57) ABSTRACT

The present invention provides a semiconductor light receiving device that prevents local heat generation, has high-speed, high-sensitivity characteristics even at the time of an intensive light input, and exhibits high resistance to light inputs. The semiconductor light receiving device includes light absorption layers (3, 4) formed on an InP semiconductor substrate (1) wherein a buffer layer (21) containing a quaternary compositional material is formed between the InP semiconductor substrate (1) and the light absorption layers (3, 4).

19 Claims, 6 Drawing Sheets

SEMICONDUCTOR LIGHT RECEIVING DEVICE

FIELD OF THE INVENTION

The present invention relates to a semiconductor light receiving device, and more particularly, to a semiconductor light receiving device that has excellent high-frequency characteristics.

BACKGROUND OF THE INVENTION

There are various kinds of semiconductor light receiving device. Among them, APD (Avalanche Photo Diodes) are devices that exhibit particularly high light-receiving sensitivity, including a multiplier function.

APD can be roughly classified into a group of devices made of Si and a group of devices formed with compound semiconductors. The devices containing compound semiconductors can be further classified into a group of devices containing GaAs as a substrate and a group of devices containing InP as a substrate. In terms of structures, those devices can be classified into a planar type or a mesa type.

Based on the differences in layer structure and carrier multiplying structure, those devices can be also classified into an electron multiplying type or a hole multiplying type.

Figure 1:
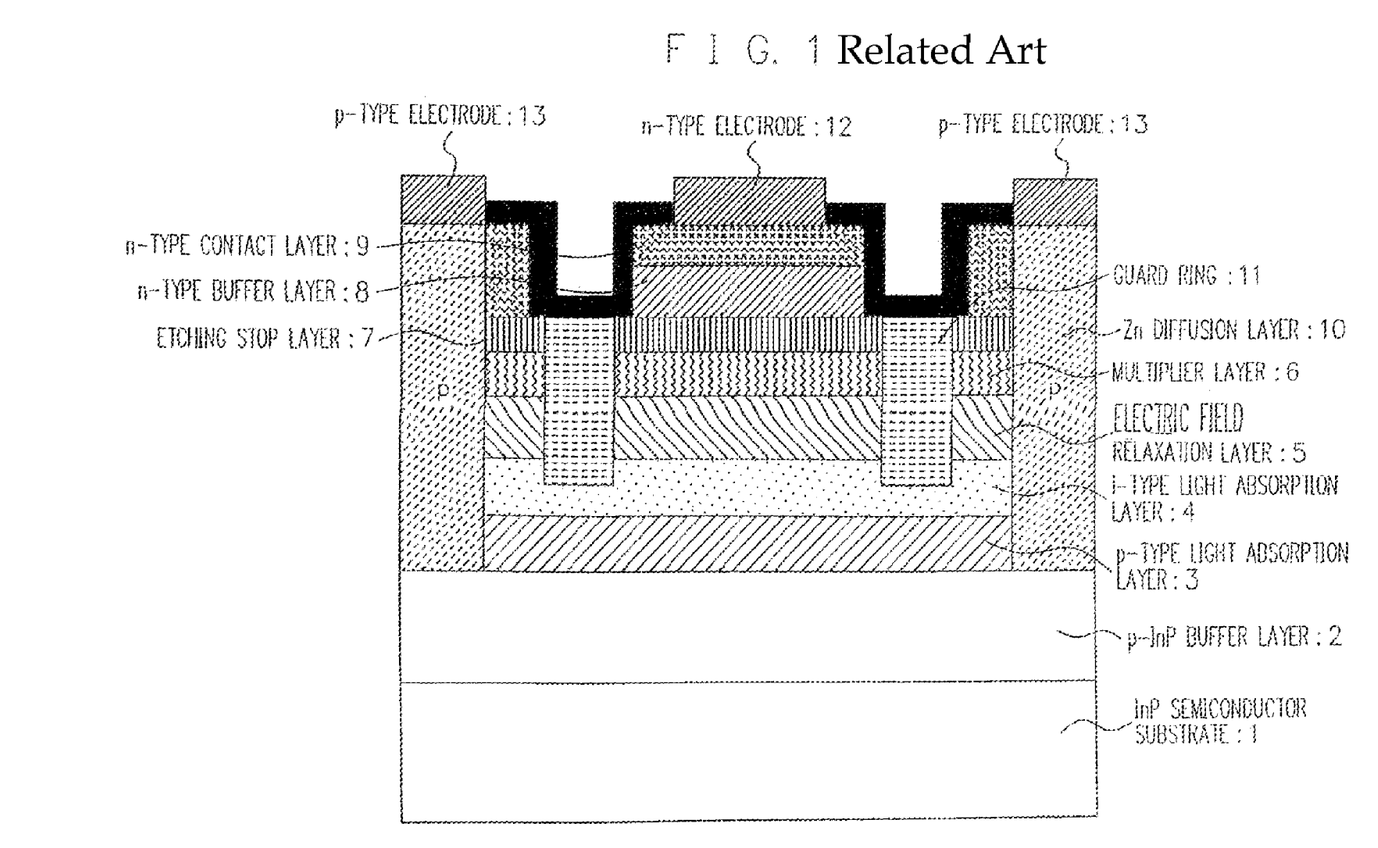
FIG. 1 illustrates a structure of a conventional semiconductor light receiving device.

Referring now to FIG. 1, a planar-structure semiconductor light receiving device of the electron multiplier type that includes a compound semiconductor is described.

As shown in FIG. 1, the planar-structure semiconductor light receiving device of the electron multiplier type includes a stack structure formed on an InP semiconductor substrate (1) made of a compound semiconductor. This stack structure includes a p-InP buffer layer (2), a p-type light absorption layer (3), an i-type light absorption layer (4), an electric field relaxation layer (5), a multiplier layer (6), an etching stop layer (7), an n-type buffer layer (8), and an n-type contact layer (9) stacked in this order. The n-type contact layer (9) and the n-type buffer layer (8) are removed around a light receiving part until the removal reaches the etching stop layer (7). Ti ions are then implanted to form a guard ring (11), and Zn diffusion is caused in the neighboring area of the guard ring (11) to form a Zn diffusion layer (10). A p-type electrode (13) is formed on the Zn diffusion layer (10). An n-type electrode (12) is formed on the n-type contact layer (9).

In the semiconductor light receiving device shown in FIG. 1, a bias voltage is adjusted by inputting signal light, so as to multiply the obtained photocurrent with the optimum multiplication factor M (M being approximately 10). As a result, a light receiver having a better reception than a p-i-n type semiconductor light receiving device can be formed by virtue of its amplifier function.

An APD receiver that shows a 10 Gb/s high-speed response can be produced by combining the semiconductor light receiving device shown in FIG. 1 with an optimum receiver circuit.

There is a document that discloses a device that includes an InP semiconductor substrate formed with a compound semiconductor, comprises a planar structure, and is of the electron multiplying type, like the semiconductor light receiving device shown in FIG. 1 (see Non-Patent Document 1, for example).

The device disclosed in the above mentioned Non-Patent Document 1 includes a stack structure formed on a semi-insulating InP substrate. This stack structure includes a p-InP buffer layer, a p-InGaAs light absorption layer, a p-InP electric field relaxation layer, a superlattice multiplier layer, an n-InP etching stop layer, an n-InAlAs cap layer, and an n-InGaAs contact layer stacked in this order. The n-InAlAs cap layer is removed in a ring-like shape surrounding the light receiving part. Ti ions are then implanted, and a Zn diffusion region is formed in the vicinity of the Ti-implanted region. A p-type electrode is formed on the Zn diffusion region.

As a patent document filed prior to the present invention, there is a document that discloses a superlattice avalanche photodiode that includes a stack structure formed on a semi-insulating semiconductor substrate or a high-concentration semiconductor substrate of a first conductivity type via a high-concentration semiconductor buffer layer of the first conductivity type. This stack structure includes a low-concentration semiconductor light absorption layer of the first conductivity type, a semiconductor electric field relaxation layer of the first conductivity type, a superlattice multiplier layer, a high-concentration semiconductor cap layer of a second conductivity type, and a high-concentration semiconductor contact layer of the second conductivity type that are stacked in this order. In the region in the vicinity of the light receiving region of this superlattice avalanche photodiode, a first conducting region is selectively formed from the surface to a location at least deeper than the semiconductor electric field relaxation layer of the first conductivity type. Further, an isolation groove structure of the depth equivalent to the thickness of the high-concentration semiconductor contact layer of the second conductivity type and the high-concentration semiconductor cap layer of the second conductivity type is formed in the boundary region between the first conducting region and the high-concentration semiconductor contact and cap layers of the second conductivity type, so that the first conducting region is not brought into contact with the high-concentration semiconductor contact and cap layers of the second conductivity type. In this manner, the surface leakage dark current that is observed in mesa-type pn-junction photodiodes can be reduced. Thus, a superlattice avalanche photodiode with a low dark current and high reliability can be provided (see Patent Document 1, for example).

Patent Document 1: Japanese Patent Publication No. 2762939

Non-Patent Document 1: "A New Planar-Structure InAlGaAs—InAlAs Superlattice Avalanche Photodiode with a Ti-Implanted Guard-Ring", I. Watanabe, et at al, IEEE PHOTONICS TECHNOLOGY LETTERS, VOL. 8, NO. 6, Jun. 1996

A high-speed, high-sensitivity semiconductor light receiving device can be constructed by forming a quasi-planar-type and electron-multiplying-type APD that includes the InP semiconductor substrate (1) made of a compound semiconductor as in the above described semiconductor light receiving device shown in FIG. 1.

However, it has become apparent that the device responsiveness might deteriorate when there is a very intensive light input to the semiconductor light receiving device show in FIG. 1.

In a case where the APD is biased, and light with high level is input to the APD while there is only weak light, the multiplication factor M normally becomes smaller, and is maintained stably. In some devices, however, the initial characteristics are degraded with certain possibility. More specifically, there might be an increase in dark current, and a short-circuit failure might be caused. This is because, when a current flows in the in-plane direction in the p-InP buffer layer (2) of the device, the current concentrates on one spot, and local heat generation occurs.

The above mentioned Non-Patent Document 1 discloses the same technique as that utilized in a planar-structure device of the electron multiplying type that includes an InP semiconductor substrate made of a compound semiconductor like the semiconductor light receiving device shown in FIG. 1. However, unlike the technique according to the present invention, the above described technique is not designed to solve the deterioration of the responsiveness of the device when there is a very intensive light input. The above mentioned Patent Document 1 discloses the high-concentration semiconductor buffer layer of the first conductivity type of approximately 0.5 to 1.0 µm in layer thickness formed on the semi-insulating semiconductor substrate or the high-concentration semiconductor substrate of the first conductivity type. However, Patent Document 1 does not suggest any solution for the problem of the deterioration of the device responsiveness caused when a very intensive light is input.

The present invention has been made in view of those circumstances, and the exemplary object of the present invention is to provide a semiconductor light receiving device that includes a quasi-planar-type and electron-multiplying-type structure formed on an InP semiconductor substrate. This semiconductor light receiving device prevents local heat generation, has high-speed, high-sensitivity characteristics even at the time of an intensive light input, and exhibits high resistance to light inputs.

BRIEF SUMMARY OF THE INVENTION

To achieve the above exemplary object, the present invention is characterized by the following features.

A semiconductor light receiving device according to an exemplary aspect of the present invention includes a light absorption layer formed on an InP semiconductor substrate, wherein a quaternary buffer layer that contains a quaternary compositional material is formed between the InP semiconductor substrate and the light absorption layer.

The semiconductor light receiving device according to the exemplary aspect of the present invention is also characterized in that the quaternary buffer layer contains composition of InxAlyGa(1-x-y)As or InxGa(1-x)AsyP(1-y), which exhibits lattice matching with InP.

The semiconductor light receiving device according to the exemplary aspect of the present invention is also characterized in that the layer thickness of the quaternary buffer layer is 0.5 µm or greater.

The semiconductor light receiving device according to the exemplary aspect of the present invention is also characterized in that the layer thickness of the quaternary buffer layer is 1.5 µm or smaller.

The semiconductor light receiving device according to the exemplary aspect of the present invention is also characterized in that bandgap energy $Eg(Q)$ of the quaternary buffer layer satisfies a relational expression: $Eg(InP)>Eg(Q)>E\lambda$ (where $Eg(InP)$ represents bandgap energy of the InP semiconductor substrate, and $E\lambda$ represents energy equivalent to wavelength of a signal light to be received).

A semiconductor light receiving device according to another exemplary aspect of the present invention includes a light absorption layer formed on an InP semiconductor substrate, wherein a current dispersion layer that disperses a current distribution is formed between the InP semiconductor substrate and the light absorption layer.

The semiconductor light receiving device according to the exemplary aspect of the present invention is characterized in that the current dispersion layer includes an impurity concentration gradient structure.

The semiconductor light receiving device according to the exemplary aspect of the present invention is characterized in that the concentration gradient structure has high concentration on a side of the InP semiconductor substrate, and has low concentration on a side of the light absorption layer.

The semiconductor light receiving device according to the exemplary aspect of the present invention is characterized in that the concentration gradient structure has a ratio $R2$ (Nb/Na) between concentration Na in the lowermost face of the concentration gradient and concentration Nb in the uppermost face of the concentration gradient within a range defined by $1>R2>R1(G1)\times0.1$ (where d represents a layer thickness of the concentration gradient structure, G1 represents a guard ring width, and $R1(G1)$ is equal to $G1/(G1+2d)$).

The semiconductor light receiving device according to the exemplary aspect of the present invention is characterized in that the concentration gradient structure has a ratio $R2=(Nb/Na)$ between the concentration Na in the lowermost face of the concentration gradient and the concentration Nb in the uppermost face of the concentration gradient within a range defined by $R2=R1(G1)$ (where d represents the layer thickness of the concentration gradient structure, G1 represents the guard ring width, and $R1(G1)$ is equal to $G1/(G1+2d)$).

The semiconductor light receiving device according to the exemplary aspect of the present invention is also characterized in that the current dispersion layer contains composition of InxAlyGa(1-x-y)As or InxGa(1-x)AsyP(1-y), which exhibits lattice matching with InP.

The semiconductor light receiving device according to the exemplary aspect of the present invention is also characterized in that bandgap energy $Eg(Q)$ of the current dispersion layer satisfies a relational expression: $Eg(InP)>Eg(Q)>E\lambda$. (where $Eg(InP)$ represents bandgap energy of the InP semiconductor substrate, and $E\lambda$ represents energy equivalent to wavelength of a signal light to be received).

The semiconductor light receiving device according to the exemplary aspect of the present invention is also characterized in that the layer thickness of the current dispersion layer is 1.5 µm or smaller.

The semiconductor light receiving device according to the exemplary aspect of the present invention is also characterized by including a crystalline quality recovery layer for dividing a connection layer formed with a connection between a ternary layer made of a ternary compositional material and a quaternary layer made of a quaternary compositional material.

The semiconductor light receiving device according to the exemplary aspect of the present invention is also characterized in that the crystalline quality recovery layer is formed between the light absorption layer and the quaternary buffer layer, or in the light absorption layer, or in the quaternary buffer layer.

The semiconductor light receiving device according to the exemplary aspect of the present invention is also characterized in that the crystalline quality recovery layer is formed between the light absorption layer and the current dispersion layer, or in the light absorption layer, or in the current dispersion layer.

The semiconductor light receiving device according to the exemplary aspect of the present invention is also characterized in that the crystalline quality recovery layer contains a binary compositional material.

The semiconductor light receiving device according to the exemplary aspect of the present invention is also characterized in that the crystalline quality recovery layer has a layer thickness within the range of 10 nm to 100 nm.

The semiconductor light receiving device according to the exemplary aspect of the present invention is also characterized in that the crystalline quality recovery layer has concentration equal to or higher than concentration in a layer in contact with the upper portion of the crystalline quality recovery layer, or has concentration equal to or lower than the concentration in layer in contact with the lower portion of the crystalline quality recovery layer.

The semiconductor light receiving device according to the exemplary aspect of the present invention is also characterized in that the width between the uppermost end of the light absorption layer and the uppermost end of the crystalline quality recovery layer is 1.5 µm or smaller.

In accordance with the present invention, a semiconductor light receiving device that includes a quasi-planar-type and electron-multiplying-type structure formed on an InP semiconductor substrate can prevent local heat generation, have high-speed and high-sensitivity characteristics even at the time of an intensive light input, and exhibit high resistance to light inputs.

DETAILED DESCRIPTION OF THE INVENTION

Figure 2:
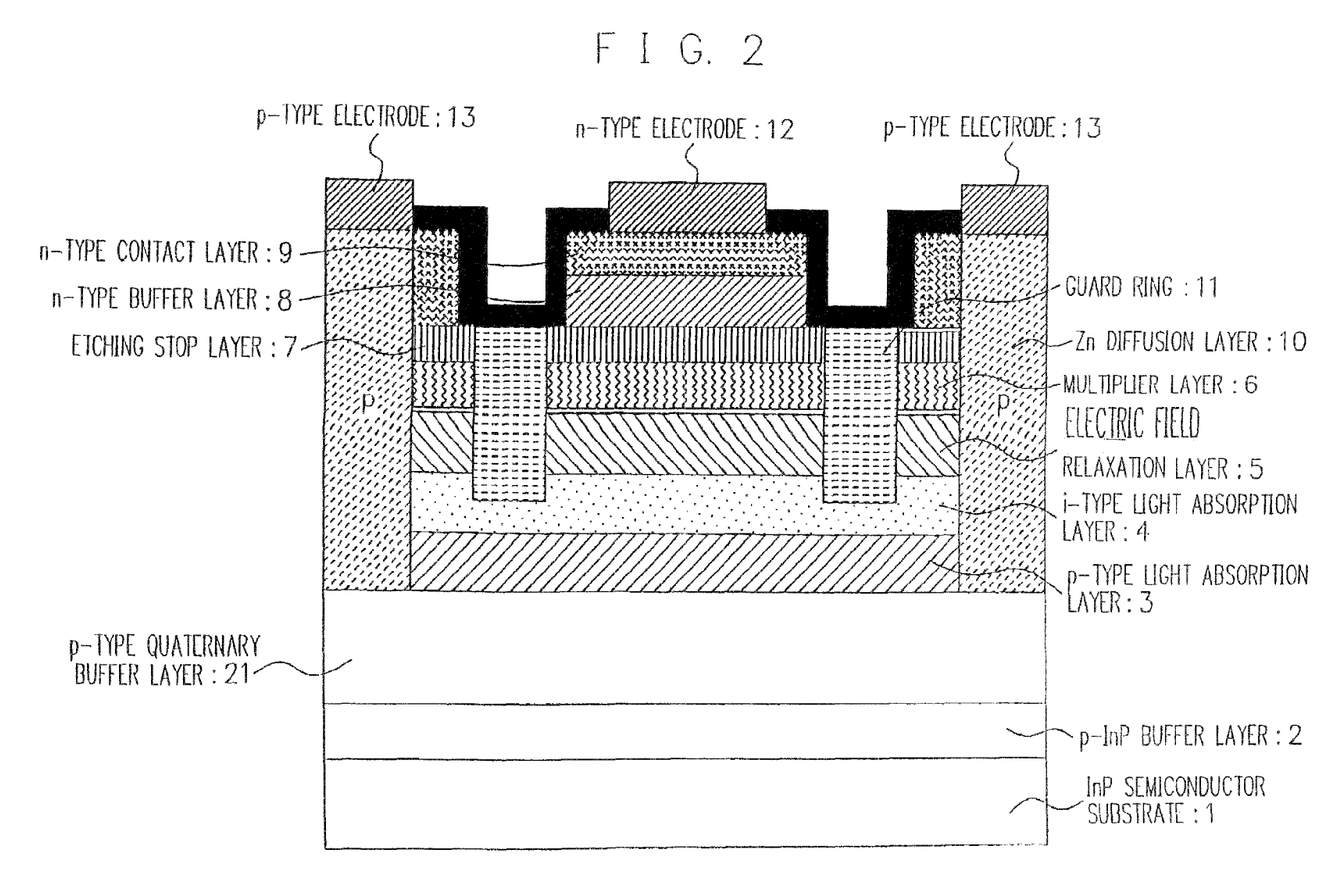
FIG. 2 illustrates a first example structure of a semiconductor light receiving device in accordance with a first exemplary embodiment.
Figure 3:
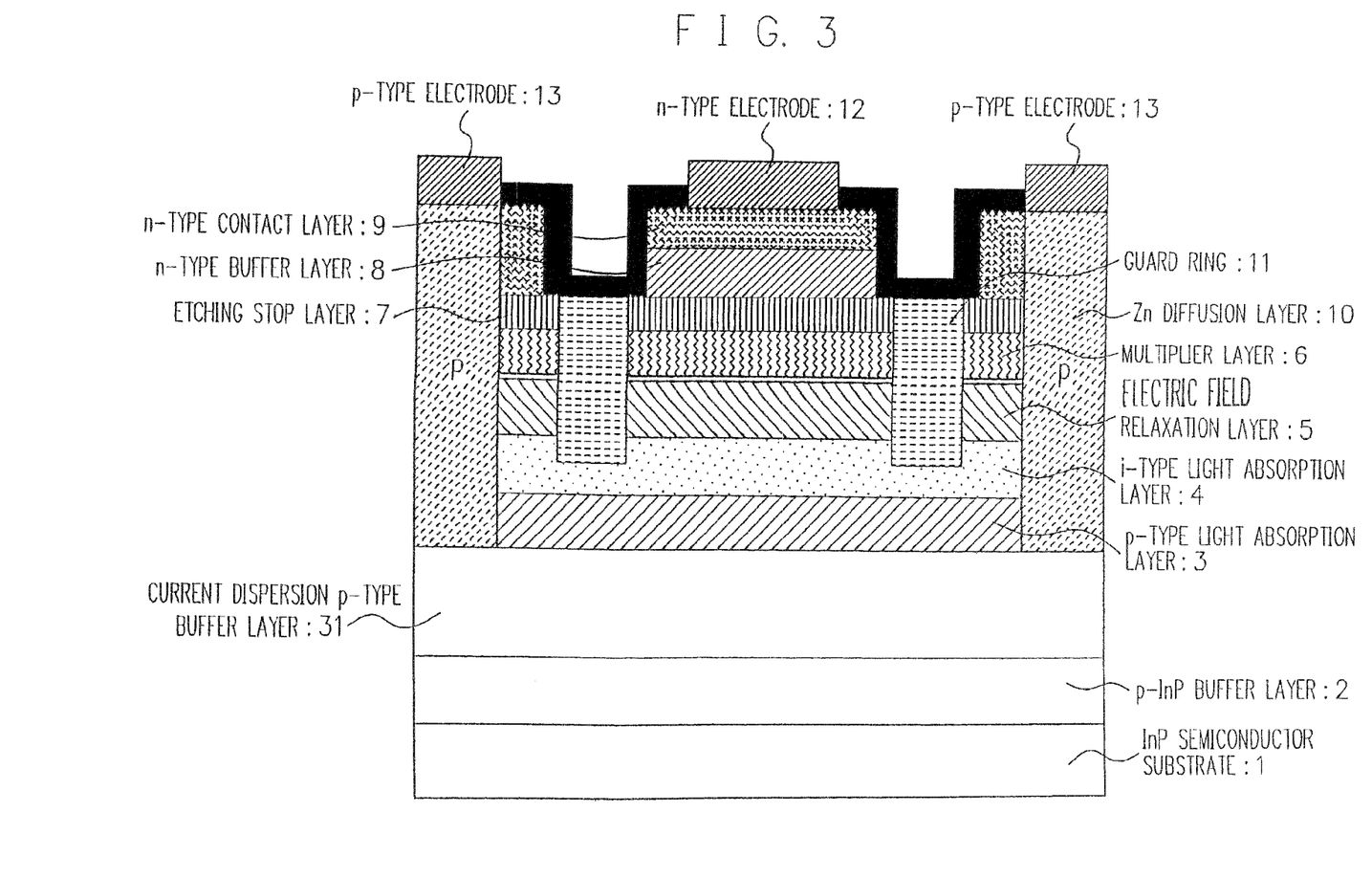
FIG. 3 illustrates a first example structure of a semiconductor light receiving device in accordance with a second exemplary embodiment.

Referring first to FIGS. 2 and 3, characteristics of a semiconductor light receiving device in accordance with an exemplary embodiment is described.

As shown in FIG. 2, the semiconductor light receiving device in accordance with the exemplary embodiment is a semiconductor light receiving device that includes light absorption layers (3, 4) formed on an InP semiconductor substrate (1), and is characterized in that a quaternary buffer layer (21) containing a quaternary compositional material is formed between the InP semiconductor substrate (1) and the light absorption layers (3, 4).

As shown in FIG. 3, the semiconductor light receiving device of the exemplary embodiment may also be a semiconductor light receiving device that includes light absorption layers (3, 4) formed on the InP semiconductor substrate (1), and is characterized in that a current dispersion layer (31) for dispersing current distributions is formed between the InP semiconductor substrate (1) and the light absorption layers (3, 4). The binary compositional material defined below is a material formed with two elements. The impurities that might be contained in the material during the manufacture and substances that have no particular influence are not counted as compositional elements. A ternary compositional material and a quaternary compositional material are defined in the same manner as above.

As described above, a p-type buffer layer formed between the InP semiconductor substrate (1) and the light absorption layers (3, 4) of a semiconductor light receiving device of the exemplary embodiment forms a layer that serves to maintain characteristics of the semiconductor device and to prevent heat concentration. More specifically, the quaternary buffer layer (21) containing a quaternary compositional material is provided in the p-type buffer layer formed with p-InP at a constant concentration, as shown in FIG. 2. Alternatively, the current dispersion layer (31) for dispersing current distributions is provided, as shown in FIG. 3. With this arrangement, it is possible to form the semiconductor light receiving device that prevents local heat generation, has high-speed, high-sensitivity characteristics even at the time of an intensive light input, and exhibits high resistance to light inputs. The following is a description of the exemplary embodiments of the present invention, with reference to the accompanying drawings.

First Exemplary Embodiment

Referring first to FIG. 2, the structure of the semiconductor light receiving device of the exemplary embodiment is described.

As shown in FIG. 2, the semiconductor light receiving device of the exemplary embodiment includes an InP semiconductor substrate (1), a p-InP buffer layer (2), a p-type quaternary buffer layer (21), a p-type light absorption layer (3), an i-type light absorption layer (4), an electric field relaxation layer (5), a multiplier layer (6), an etching stop layer (7), an n-type buffer layer (8), and an n-type contact layer (9).

In the semiconductor light receiving device of the exemplary including the layer structure shown in FIG. 2, the n-type contact layer (9) and the n-type buffer layer (8) are removed around a light receiving part from the above, until the removal reaches the etching stop layer (7). Ti ions are then implanted to form a guard ring (11). Zn diffusion is then caused in the neighboring area of the guard ring (11), so as to form a Zn diffusion layer (10) in the vicinity of the light receiving part. A p-type electrode (13) is provided on the Zn diffusion layer (10), and an n-type electrode (12) is provided on the n-type contact layer (9).

In the semiconductor light receiving device of the exemplary embodiment, the p-InP buffer layer (2) is of the p-type as shown in FIG. 2, but may be of the i-type or the n-type.

It is preferable that the p-type quaternary buffer layer (21) is formed with a composition that exhibits lattice matching with InP, such as InxAlyGa(1-x-y)As or InxGa(1-x)AsyP(1-y).

The p-type quaternary buffer layer (21) in the exemplary embodiment is designed to transmit the current generated by the holes generated in the light receiving part without loss. Therefore, the p-type quaternary buffer layer (21) should preferably have a great layer thickness and higher concentration.

For example, the layer thickness d of the p-type quaternary buffer layer (21) is set at 0.5 µm or greater, so that the effect of transmitting current can be increased.

Bandgap energy Eg(Q) of the p-type quaternary buffer layer (21) increases the p-type concentration to make the electric conduction greater. Therefore, the bandgap energy Eg(Q) should preferably be smaller than bandgap energy Eg(InP) of the InP semiconductor substrate (1). In a case of a back-face incident type, however, a signal light passes through the p-InP buffer layer (2). Therefore, the bandgap energy Eg(Q) of the p-type quaternary buffer layer (21) should preferably be larger than energy Eλ equivalent to the wavelength of the signal light to be received, so as not to cause light loss. Accordingly, the bandgap energy Eg(Q) of the p-type quaternary buffer layer (21) should preferably satisfy the following relational expression (1).

$$Eg(InP) > Eg(Q) > E\lambda \qquad \text{Relational expression (1)}$$

Eg(InP): the bandgap energy of the InP semiconductor substrate (1)

Eg(Q): the bandgap energy of the p-type quaternary buffer layer (21)

$E\lambda$: the energy equivalent to the wavelength of the signal light to be received Since the wavelength of 1.3 µm to 1.55 µm is generally used for the signal light, the bandgap energy Eg(Q) of the p-type quaternary buffer layer (21) should preferably satisfy the relational expression (1): $Eg(InP) > Eg(Q) > E\lambda$ ($\lambda = 1.3$ µm).

Also, the p-type quaternary buffer layer (21) functions as a low-resistance buffer layer when the p-concentration is equal to or higher than $5 \times 10^{17}$ cm$^{-3}$. However, it is preferable that the p-type quaternary buffer layer (21) also has lower resistance than the p-type light absorption layer (3).

The p-type quaternary buffer layer (21) can be a layer with higher impurity concentration within the range of approximately $2 \times 10^{18}$ cm$^{-3}$ to $1 \times 10^{19}$ cm$^{-3}$, compared with the p-InP buffer layer (2). Therefore, even if the concentration in the p-type light absorption layer (3) is increased to $1 \times 10^{18}$ cm$^{-3}$, the p-type quaternary buffer layer (21) can be a buffer layer with lower resistivity than the p-type light absorption layer (3).

Next, the problems that can be caused in a case where the p-type quaternary buffer layer (21) is used as in the semiconductor light receiving device of the exemplary embodiment, and the method for solving those problems are described.

In a case where the p-type quaternary buffer layer (21) is employed in the semiconductor light receiving device, the layer structure portion that does not contain InP becomes thick, even if only materials that exhibit lattice matching with the InP semiconductor substrate (1) are used. When an APD structure is formed on the layer structure portion, a crystalline quality of the light absorption layers (3, 4) and the multiplier layer (6) is degraded, resulting in an increase in dark current.

The above described crystalline quality is determined solely from an amount of dark current generated, but is not evaluated based on intensity or line width of photoluminescence, intensity or half width of signals measured by X-ray diffraction, or the like.

Figure 4:
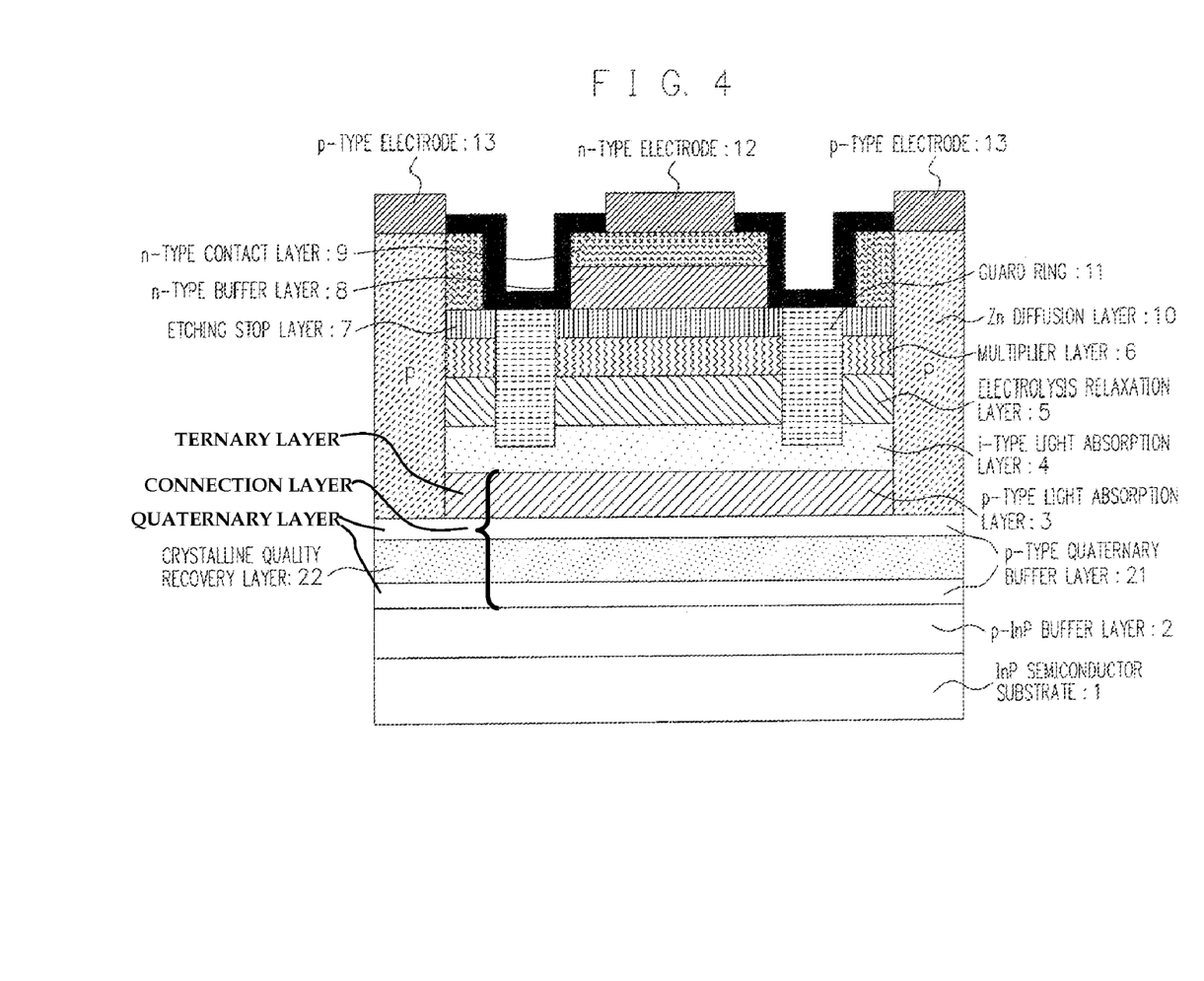
FIG. 4 illustrates a second example structure of the semiconductor light receiving device in accordance with the first exemplary embodiment.

For solving the above described problem, a crystalline quality recovery layer (22) containing a binary material (InP) is formed on the connection portion of a ternary layer and a quaternary layer, so that the layer that forms the connection portion of the ternary layer and the quaternary layer is divided. In this manner, the connection between the ternary layer and the quaternary layer is made smaller.

The degradation of the crystalline quality due to the connection between a ternary layer and a quaternary layer occurs when the connection layer becomes approximately 1.5 µm or greater in thickness. Therefore, it is preferable to form the crystalline quality recovery layer (22) containing a binary material (InP) on the layer forming the connection portion between the ternary layer and the quaternary layer, not to exceed 1.5 µm in thickness of the connection layer.

Even if the crystalline quality recovery layer (22) is very thin, the effect of the layer can be achieved, as long as the thickness of the crystalline quality recovery layer (22) is 10 nm or greater.

The above described effect can be made more prominent by increasing the layer thickness of the crystalline quality recovery layer (22). However, the recovery effect begins to reach a saturation point when the layer thickness of the crystalline quality recovery layer (22) is 100 nm or greater. Therefore, it is preferable that the layer thickness of the crystalline quality recovery layer (22) is within the range of 10 nm to 100 nm.

In a case where the layer thickness of the light absorption layers (3, 4) is 1.5 µm or smaller, the crystalline quality recovery layer (22) is provided between the lowermost portions of the light absorption layers (3, 4) and the points located 1.5 µm below the uppermost portion of the light absorption layers (3, 4), so as to achieve the effect.

For example, in a case where the layer thickness d of the light absorption layers (3, 4) including the composition of InGaAs is 1.2 µm, and the layer thickness d of the p-type quaternary buffer layer (21) is 0.5 µm, it is preferable to provide the crystalline quality recovery layer (22) between points A and B, with the point A being the uppermost portion of the p-type quaternary buffer layer (21), and the point B being the points located 0.3 µm below the uppermost portion of the p-type quaternary buffer layer (21).

In a case where the layer thickness d of the light absorption layers (3, 4) is 1.5 µm or greater, it is preferable to provide the crystalline quality recovery layer (22) inside the light absorption layers (3, 4) or at the lowermost portions of the light absorption layers (3, 4).

In a case where the crystalline quality recovery layer (22) is provided inside the light absorption layers (3, 4), band disconnections such as $\Delta Ev$ and $\Delta Ec$ are large in most cases, and prevent carrier movement. Therefore, a layer structure for reducing the band disconnections such as $\Delta Ev$ and $\Delta Ec$ should preferably be provided above and below the crystalline quality recovery layer (22). With this arrangement, a hindrance to the carrier movement can be avoided. The layer structure for reducing the band disconnections such as $\Delta Ev$ and $\Delta Ec$ is formed with materials having the electron conduction band and a valence band being in InGaAs and InP, respectively. For example, it is possible to reduce $\Delta Ec$ and $\Delta Ev$ effectively by employing a quaternary layer (InAlGaAs, InGaAsP) having the bandgap energy Eg of a 1.3 µm composition obtained through light wavelength conversion, or forming materials of 1.5 µm, 1.3 µm, and 1.1 µm compositions continuously between InGaAs and InP.

Also, it is possible to avoid degradation of the crystalline quality by restricting the layer thickness from the crystalline quality recovery layer (22) to the side of the InP semiconductor substrate (1) to be 1.5 µm or smaller.

Example 1 of First Exemplary Embodiment

Referring to FIG. 2, a first example structure of the semiconductor light receiving device of the first exemplary embodiment is now described.

As shown in FIG. 2, the semiconductor light receiving device of the exemplary embodiment includes the stack structure formed on the InP semiconductor substrate (1). The stack structure includes the p-InP buffer layer (2), the p-type quaternary buffer layer (21), the p-type light absorption layer (3), the i-type light absorption layer (4), the electric field relaxation layer (5), the multiplier layer (6), the etching stop layer (7), the n-type buffer layer (8), and the n-type contact layer (9) stacked in this order. The n-type contact layer (9) and the n-type buffer layer (8) are removed around the light receiving part until the removal reaches the etching stop layer (7). Ti ions are then implanted to form the guard ring (11). After a dielectric film is formed, Zn diffusion is caused in the neighboring area of the guard ring (11) to form the Zn diffusion layer (10). The p-type electrode (13) is formed on the Zn diffusion layer (10). The n-type electrode (12) is formed on the n-type contact layer (9). The incident face of the lower portion of the InP semiconductor substrate (1) is coated with an AR (Anti-Reflection) coating.

In the semiconductor light receiving device of the exemplary embodiment shown in FIG. 2, the p-type quaternary buffer layer (21) having high impurity concentration is provided on the InP semiconductor substrate (1) that is a compound semiconductor substrate, so that the current corresponding to the photocarriers reaching the p-type light absorption layer (3) flows easily. In this manner, it becomes possible to form a device in which initial characteristics will not be degraded by a light input of approximately 10 mW when the multiplication factor M is small.

Example 2 of First Exemplary Embodiment

Referring now to FIG. 4, a second example structure of the semiconductor light receiving device of the first exemplary embodiment is described.

As shown in FIG. 4, the semiconductor light receiving device of the exemplary embodiment includes the stack structure formed on an InP semiconductor substrate (1). The stack structure includes the p-InP buffer layer (2), the p-type quaternary buffer layer (21), the crystalline quality recovery layer (22), the p-type light absorption layer (3), the i-type light absorption layer (4), the electric field relaxation layer (5), the multiplier layer (6), the etching stop layer (7), the n-type buffer layer (8), and the n-type contact layer (9) stacked in this order. The n-type contact layer (9) and the n-type buffer layer (8) are removed around the light receiving part until the removal reaches the etching stop layer (7). Ti ions are then implanted to form the guard ring (11). After a dielectric film is formed, Zn diffusion is caused in the neighboring area of the guard ring (11) to form the Zn diffusion layer (10). The p-type electrode (13) is formed on the Zn diffusion layer (10). The n-type electrode (12) is formed on the n-type contact layer (9). The incident face at the lower portion of the InP semiconductor substrate (1) is coated with an AR (Anti-Reflection) coating.

The p-type quaternary buffer layer (21) includes a composition of InAlGaAs that exhibits lattice matching with the InP, a bandgap energy Eg of approximately 1.1 μm in light wavelength, a layer thickness d of 1.0 μm, and p-concentration Nd of $5 \times 10^{18}$ cm$^{-3}$.

The crystalline quality recovery layer (22) includes a composition of p-InP, a layer thickness d of 0.1 μm, has p-concentration Nd of $1 \times 10^{18}$ cm$^{-3}$.

The p-type light absorption layer (3) includes a composition of InGaAs, a layer thickness d of 0.5 μm, and p-concentration Nd of $5 \times 10^{17}$ cm$^{-3}$.

The i-type light absorption layer (4) includes a composition of InGaAs, a layer thickness d of 0.7 μm, and p-concentration Nd of $5 \times 10^{15}$ cm$^{-3}$.

In the semiconductor light receiving device of the exemplary embodiment shown in FIG. 4, the p-type quaternary buffer layer (21) having high impurity concentration is provided on the InP semiconductor substrate (1) that is a compound semiconductor substrate, so that the current corresponding to the photocarriers reaching the p-type light absorption layer (3) flows easily. In this manner, it becomes possible to form a device in which the initial characteristics will not be degraded by a light input of approximately 10 mW when the multiplication factor M is small. Particularly, the layer thickness d of the p-type quaternary buffer layer (21) is as thick as 1.0 μm, so that the semiconductor light receiving device shown in FIG. 4 can exhibit a greater effect.

In the semiconductor light receiving device shown in FIG. 4, the layer connecting a ternary layer and a quaternary layer is thick at the p-type quaternary buffer layer (21) and the light absorption layers (3, 4) (if the crystalline quality recovery layer (22) is missing from the structure shown in FIG. 4, for example, the thickness d of the connection layer of the p-type quaternary buffer layer (21), the p-type light absorption layer (3), and the i-type light absorption layer (4) is as thick as 1.0+0.5+0.7=2.2 μm). Therefore, the crystalline quality recovery layer (22) is inserted between the p-type quaternary buffer layer (21) and the p-type light absorption layer (3), so as to reduce the connection between the ternary layer and the quaternary layer. In this manner, the dark current in the device can be reduced. Alternatively, the crystalline quality recovery layer (22) may be provided in the p-type light absorption layer (3) or in the p-type quaternary buffer layer (21).

Second Exemplary Embodiment

Next, a second exemplary embodiment is described.

As shown in FIG. 3, the semiconductor light receiving device of the second exemplary embodiment includes the InP semiconductor substrate (1), the p-InP buffer layer (2), the current dispersion p-type buffer layer (31), the p-type light absorption layer (3), the i-type light absorption layer (4), the electric field relaxation layer (5), the multiplier layer (6), the etching stop layer (7), the n-type buffer layer (8), and the n-type contact layer (9).

In the semiconductor light receiving device of the second exemplary embodiment including the layer structure shown in FIG. 3, the n-type contact layer (9) and the n-type buffer layer (8) are removed around the light receiving part from the above, until the removal reaches the etching stop layer (7). Ti ions are then implanted to form the guard ring (11). Zn diffusion is then caused in the neighboring area of the guard ring (11), so as to form the Zn diffusion layer (10) in the vicinity of the light receiving part. The p-type electrode (13) is provided on the Zn diffusion layer (10), and the n-type electrode (12) is provided on the n-type contact layer (9).

In the semiconductor light receiving device of the second exemplary embodiment, the p-InP buffer layer (2) is of the p-type as shown in FIG. 3, but may be of the i-type or the n-type.

The semiconductor light receiving device in accordance with the second exemplary embodiment is characterized in that the current dispersion p-type buffer layer (31) comprising the function of dispersing the current newly flowing in the in-plane direction uniformly is provided between the p-InP buffer layer (2) and the light absorption layers (3, 4).

The p-InP buffer layer (2) is formed to have constant impurity concentration, and the resistivity of the p-InP buffer layer (2) is also constant in the layer. Accordingly, the current generated by photocarriers flows through the shortest path with respect to the p-type electrode (13), and the width of the path becomes narrower.

Figure 5:
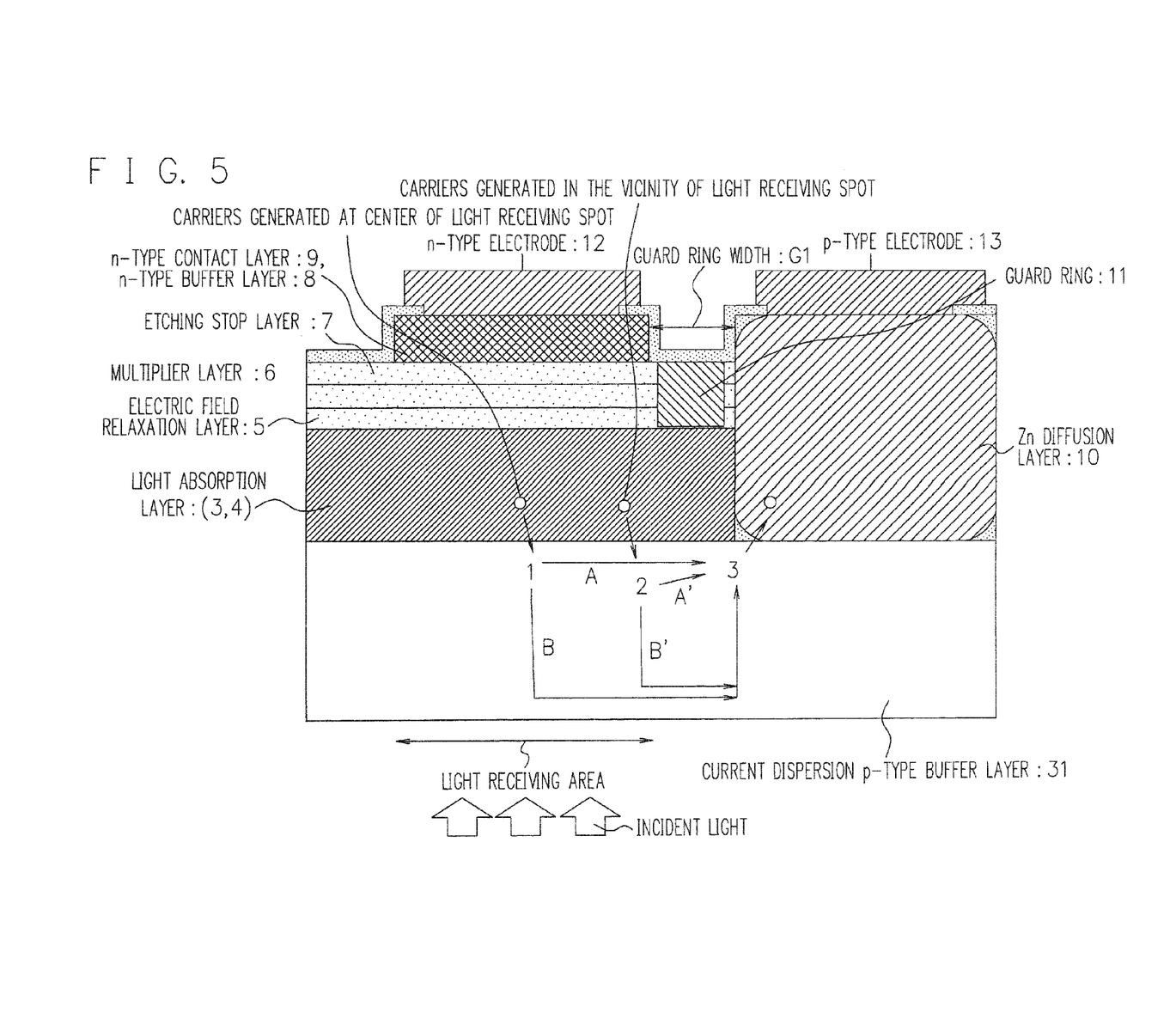
FIG. 5 is a drawing for explaining a current dispersing function of the semiconductor light receiving device in accordance with the second exemplary embodiment.

The current dispersion p-type buffer layer (31) is designed intending to form a distribution of resistivity in the layer and disperse the current generated by photocarriers uniformly in the layer. With this arrangement, the current density becomes lower, and the device can achieve higher reliability. Referring now to FIG. 5, the method for realizing this current dispersing function is described.

When carriers are generated in the light absorption layers (3, 4) at the center of the light receiving part, the current generated by holes passes through a path "A" or a path "B", and reaches the p-type electrode (13) via the current dispersion p-type buffer layer (31) and the Zn diffusion layer (10).

If the resistance value of the path "A" is equal to the resistance value of the path "B", or the resistance value of the path "A" is close to the resistance value of the path "B", the current passes through both paths "A" and "B", and current concentration can be reduced.

The distance of the path "A" is equal to the distance "L" from the point immediately below the light receiving part to the outer periphery of the guard ring (11). The distance of the path "B" is equal to the distance from the point immediately below the light receiving part to the outer periphery of the guard ring (11) via the lowermost portion of the current dispersion p-type buffer layer (31) in the outer peripheral direction. Where the layer thickness of the current dispersion p-type buffer layer (31) is represented by d, the distance of the path "B" is expressed as d+L+d, and the ratio in distance between the path "A" and the path "B" is expressed as R1(L)=L/(L+2d).

To realize the current dispersing function, the two paths "A" and "B" are designed to have the same resistance.

Therefore, the current dispersion p-type buffer layer (31) has lower resistance at its lower portion and has higher resistance at its upper portion, so that the path "B" at a longer distance than the path "A" has the lower resistance. In view of this an impurity concentration gradient structure is employed.

The concentration gradient structure is designed to have the impurity concentration that is higher at the lower portion of the current dispersion p-type buffer layer (31) and is lower at the upper portion of the current dispersion p-type buffer layer (31).

In the following, Na represents the concentration in the lowermost face of the concentration gradient layer of the concentration gradient structure, Nb represents the concentration in the uppermost face of the concentration gradient layer, and the ratio R2 in the concentration gradient is expressed as R2=Nb/Na. The gradient in the vertical direction of the concentration gradient layer is not particularly limited, and may be a primary gradient or a secondary gradient.

For example, when R1=R2 is established, the resistance of the uppermost face of the concentration gradient structure becomes substantially equal to the resistance of the lowermost face of the concentration gradient structure, and the current dispersing function can be realized.

The distance "L" from the point immediately below the light receiving part to the outer periphery of the guard ring (11) varies with the location of the light receiving part. Therefore, the relationship R1=R2 cannot be established for all the carriers existing in the plane of the light receiving part. For example, the path at the center of the light receiving part is expressed as: R1(L0)=L0/(L0+2d), where L0 represents the distance of the path "A".

In the vicinity of the light receiving part, a path "A'" and a path "B'" are compared with each other. The distance "L" of the path "A'" is substantially equal to the guard ring width "G1" shown in FIG. 5. Accordingly, the equation, R1(G1)=G1/(G1+2d), is established. Also, the relationship "R1 of the center of the light receiving part >R1 of the region in the vicinity of the light receiving part" is established.

If R1 is determined with the use of the value at the center of the light receiving part, the effect can be achieved only at the center of the light receiving part. However, if the value of the region in the vicinity of the light receiving part is used for R1, the effect can be achieved on the entire circumference located at the same distance from the center of the light receiving part. Therefore, the actual set value of R1 is adjusted to the value of the region in the vicinity of the light receiving part, so as to achieve a greater effect.

Where the p-concentration Na in the lowermost face of the concentration gradient structure is $1\times10^{18}$ cm$^{-3}$, the light receiving diameter of the device is 30 µm, and the distance G1 in the radial direction of the isolation groove is 5 µm, the equation, L0=15+5=20 µm, is established.

The current dispersing effect at the center of the light receiving part can be made greater by reducing the concentration in the lowermost face of the concentration gradient structure by 9% or more, with the equation, R1(L0)=20/(20+2)=0.909, being established.

To achieve the same effect as above in the neighborhood of 5 µm from the vicinity of the light receiving part, the equation, R1(5+5)=10/(10+2)=0.833, is established, and the concentration Nb is set at $8.33\times10^{17}$ cm$^{-3}$.

To achieve the same effect as above in the neighborhood of 1 µm from the vicinity of the light receiving part, the equation, R1(5+1)=6/(6+2)=0.75, is established, and the concentration Nb is set at $7.5\times10^{17}$ cm$^{-3}$.

To achieve the same effect as above at the end of the light receiving part, the equation, R1(G1)=G1/(G1+2d)=5/(5+2)=0.714, is established, and the concentration Nb is set at $7.1\times10^{17}$ cm$^{-3}$.

Since the maximum concentration gradient rate to achieve the effect is approximately R1(G1)5=0.071, the concentration Nb in the uppermost face of the concentration gradient structure is set at $1.4\times10^{17}$ cm$^{-3}$ or higher.

If R1 is too small, the effect is reduced again. Therefore, the value of R1 is set at a value at least greater than 1/10 of the value of R1 of the region in the vicinity of the light receiving part.

In view of this, it is preferable that the concentration gradient structure has the ratio R2=(Nb/Na) between concentration Na in the lowermost face of the concentration gradient and the concentration Nb in the uppermost face of the concentration gradient within a range defined by 1>R2>R1(G1)× 0.1 (where d represents the layer thickness of the concentration gradient structure, G1 represents the guard ring width, and R1(G1) is equal to G1/(G1+2d)).

As the layer thickness of the current dispersion p-type buffer layer (31) is greater, the effect of reducing the current density becomes larger. Therefore, it is preferable to make the layer thickness greater.

For example, the current dispersing effect can be increased by setting the layer thickness d of the current dispersion p-type buffer layer (31) at 0.5 µm or greater.

In a case where the layer thickness d of the current dispersion p-type buffer layer (31) is 0.5 µm, the diameter of the light receiving part is 30 µm, and the current flows evenly in the thickness direction of the current dispersion p-type buffer layer (31), the area of the current path in the vicinity of the light receiving part is 2×pi×15×0.5=47.1 µm$^2$, according to the calculation expression: "the circumference of the light receiving part"×"the layer thickness of the current dispersion p-type buffer layer (31)". Therefore, when a photoelectric current of 10 mA flows, the maximum value of the current density is at least 21 kA/cm$^2$.

In a case where the layer thickness d of the current dispersion p-type buffer layer (31) is 1.0 µm, the current density is at least 11 kA/cm$^2$ or higher.

In a case where the layer thickness d of the current dispersion p-type buffer layer (31) is 2.0 µm, the current density is 5 kA/cm$^2$ or higher.

Accordingly, the current density becomes lower, as the layer thickness of the current dispersion p-type buffer layer (31) increases. In this manner, higher resistance to light can be achieved. To achieve higher device reliability, the layer thickness d of the current dispersion p-type buffer layer (31) is preferably set to 0.5 µm or greater. With the efficiency in formation of semiconductor light receiving devices being taken into consideration, the total layer thickness of the concentration gradient layer is preferably set to 5.0 µm or smaller.

To increase the p-concentration and achieve higher electric conductivity, the bandgap energy Eg(Q) of the current dispersion p-type buffer layer (31) is preferably formed with a quaternary composition. Particularly, in a case where the InP semiconductor substrate (1) is used as a compound semiconductor, it is preferable to employ InAlGaAs or InGaAsP, which exhibits lattice matching with the InP semiconductor substrate (1). As described above, impurities and other substances that have no particular influence are not counted in compositional elements. Therefore, in a case where P is included to the compound semiconductor InAlGaAs, the resultant is not regarded as a five-element composition, but is regarded as a quaternary composition.

To form the p-type buffer layer (31) having high concentration, the bandgap energy Eg(Q) of the current dispersion p-type buffer layer (31) should preferably be smaller than the bandgap energy Eg(InP) of the InP semiconductor substrate (1). In a case of a back-face incident type, however, the signal light passes through the current dispersion p-type buffer layer (31). Therefore, the bandgap energy Eg(Q) of the current dispersion p-type buffer layer (31) should preferably be larger than the energy Eλ equivalent to the wavelength of the signal light to be received, so as not to cause light loss. Accordingly, the bandgap energy Eg(Q) of the current dispersion p-type buffer layer (31) should preferably satisfy the following relational expression (2).

$$Eg(InP) > Eg(Q) > E\lambda \qquad \text{Relational expression (1)}$$

Eg(InP): the bandgap energy of the InP semiconductor substrate (1)

Eg(Q): the bandgap energy of the current dispersion p-type buffer layer (31)

Eλ: the energy equivalent to the wavelength of the signal light to be received

Since the wavelength of 1.3 µm to 1.55 µm is generally used for the signal light, it is preferable that the bandgap energy Eg(Q) of the current dispersion p-type buffer layer (31) satisfy the relational expression (2): Eg(InP)>Eg(Q)>Eλ (λ=1.3 µm)

Next, the problems that can be caused in a case where the current dispersion p-type buffer layer (31) is used as in the semiconductor light receiving device of the exemplary embodiment, and the method for solving those problems are described.

Since a quaternary compositional material is employed for the current dispersion p-type buffer layer (31) used in the second exemplary embodiment, the current dispersion p-type buffer layer (31) and the light absorption layers (3, 4) form a connection structure of a quaternary layer and ternary layers, and the crystalline quality might be degraded, as in the semiconductor light receiving device of the first exemplary embodiment.

The above described degradation of the crystalline quality is a phenomenon in which the dark current flowing with respect to a certain electric field increases. In a case of an APD, the dark current is multiplied as total dark current. Therefore, degradation of the crystalline quality results in remarkable deterioration of the device performance.

Figure 6:
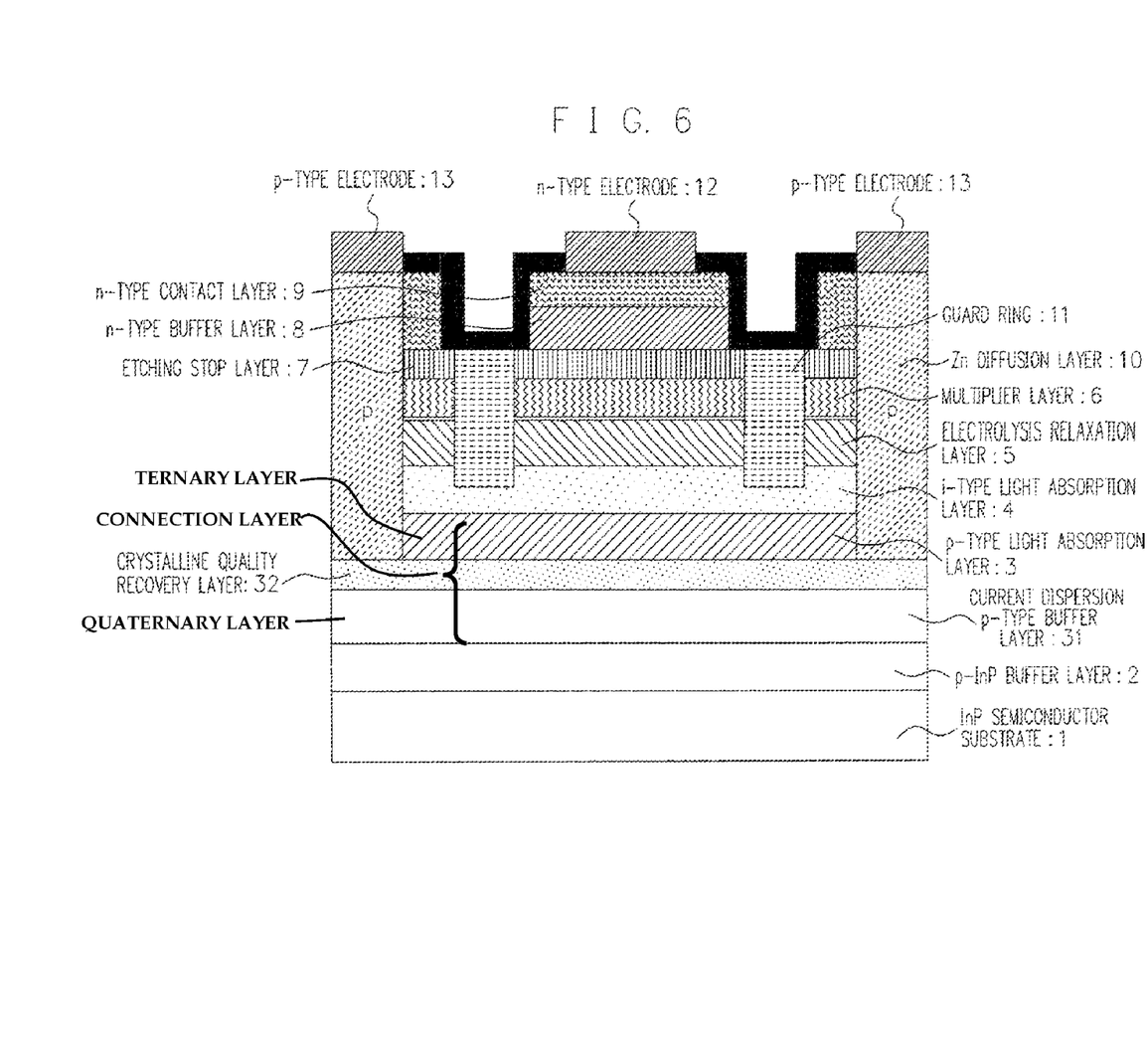
FIG. 6 illustrates a second example structure of the semiconductor light receiving device in accordance with the second exemplary embodiment.

To avoid such a problem, a thin-film crystalline quality recovery layer (32) containing a binary material (InP) is inserted on the uppermost portion of the current dispersion p-type buffer layer (31) in the semiconductor light receiving device of the exemplary embodiment, as shown in FIG. 6.

The degradation of the crystalline quality due to the connection between a ternary layer and a quaternary layer starts when the connection layer becomes approximately 1.5 µm or greater in thickness. Therefore, it is preferable to insert the crystalline quality recovery layer (32) containing a binary material (InP) on the layer forming the connection portion between the ternary layer and the quaternary layer with condition in which the connection layer between the ternary layer and the quaternary layer is 1.5 µm or less.

Even if the crystalline quality recovery layer (32) is very thin, the effect of the layer can be achieved, as long as the thickness of the crystalline quality recovery layer (32) is 10 nm or greater.

The above described effect can be made more prominent by increasing the layer thickness of the crystalline quality recovery layer (32). However, the recovery effect begins to reach a saturation point when the layer thickness of the crystalline quality recovery layer (22) is 100 nm or greater. Therefore, it is preferable that the layer thickness of the crystalline quality recovery layer (32) is within the range of 10 nm to 100 nm.

The impurity concentration in the crystalline quality recovery layer (32) may be set in the same range as or a higher range than the concentration range of the layer in contact with the upper face of the crystalline quality recovery layer (32), or may be set in the same range as or a lower range than the concentration range of the layer in contact with the lower face of the crystalline quality recovery layer (32). With this arrangement, the current can flow smoothly.

In a case where the layer thickness of the light absorption layers (3, 4) is 1.5 µm or smaller, the crystalline quality recovery layer (32) is provided between the lowermost portions of the light absorption layers (3, 4) and the points located 1.5 µm below the uppermost portions of the light absorption layers (3, 4), so as to achieve the effect.

For example, in a case where the layer thickness d of the light absorption layers (3, 4) having the composition of InGaAs is 1.2 µm, and the layer thickness d of the current dispersion p-type buffer layer (31) is 0.5 µm or greater, it is preferable to provide the crystalline quality recovery layer (32) between points A and B, with the point A being the uppermost portion of the current dispersion p-type buffer layer (31), and the point B being the point located 0.3 µm toward the InP semiconductor substrate (1) from the uppermost portion A of the current dispersion p-type buffer layer (31).

In a case where the layer thickness d of the light absorption layers (3, 4) is 1.5 µm or greater, it is preferable to provide the crystalline quality recovery layer (32) inside the light absorption layers (3, 4) or at the lowermost portions of the light absorption layers (3, 4).

In a case where the crystalline quality recovery layer (32) is provided inside the light absorption layers (3, 4), the band disconnections such as ΔEv and ΔEc are large in most cases, and prevent carrier movement. Therefore, a layer structure for reducing the band disconnections such as ΔEv and ΔEc is preferably provided above and below the crystalline quality recovery layer (32). With this arrangement, hindrance to the carrier movement can be eliminated. The layer structure for reducing the band disconnections such as ΔEv and ΔEc is formed with materials having the electron conduction band and the valence band existing in InGaAs and InP, respectively. For example, it is possible to reduce ΔEc and ΔEv effectively by employing a quaternary layer (InAlGaAs, InGaAsP) having the bandgap energy Eg of a 1.3 µm composition obtained by light wavelength conversion, or forming materials of 1.5 µm, 1.3 µm, and 1.1 µm compositions continuously between InGaAs and InP.

Also, the layer thickness from the crystalline quality recovery layer (32) to the side of the InP semiconductor substrate (1) is restricted to 1.5 µm or smaller, so as to avoid degradation of the crystalline quality.

Example 1 of Second Exemplary Embodiment

Referring to FIG. 3, a first example structure of the semiconductor light receiving device of the second exemplary embodiment is now described.

As shown in FIG. 3, the semiconductor light receiving device of the second exemplary embodiment includes the stack structure formed on the InP semiconductor substrate (1). The stack structure includes the p-InP buffer layer (2), the current dispersion p-type buffer layer (31), the p-type light absorption layer (3), the i-type light absorption layer (4), the electric field relaxation layer (5), the multiplier layer (6), the etching stop layer (7), the n-type buffer layer (8), and the n-type contact layer (9) stacked in this order. The n-type contact layer (9) and the n-type buffer layer (8) are removed around the light receiving part until the removal reaches the etching stop layer (7). Ti ions are then implanted to form the guard ring (11). After a dielectric film is formed, Zn diffusion is caused in the neighboring area of the guard ring (11) to form the Zn diffusion layer (10). The p-type electrode (13) is formed on the Zn diffusion layer (10). The n-type electrode (12) is formed on the n-type contact layer (9). The incident face at the lower portion of the InP semiconductor substrate (1) is coated with an AR (Anti-Reflection) coating.

The p-InP buffer layer (2) has a layer thickness d of 0.5 µm, and p-concentration Nd of $5.0 \times 10^{17}$ cm$^{-3}$.

The current dispersion p-type buffer layer (31) is formed as a concentration gradient layer that includes the composition of InAlGaAs, has a layer thickness d of 1 µm, has the bandgap energy Eg equivalent to $\lambda = 1.1$ µm in light wavelength, has p-concentration Na of $1 \times 10^{18}$ cm$^{-3}$ in the lowermost face of the concentration gradient layer. If the device light receiving diameter is 30 µm, and the distance G1 in the radial direction of the isolation groove is 5 µm, the following equation is established: $L0 = 15 + 5 = 20$ µm.

To have the effect on the photocarriers received at the light receiving end of the light receiving part, the following conditions are preferably satisfied: $R1(G1) = G1/(G1+2d) = 5/(5+2) = 0.714$; and the p-concentration Nb in the uppermost face of the concentration gradient layer is $7.1 \times 10^{17}$ cm$^{-3}$.

In the semiconductor light receiving device of the second exemplary embodiment, the current dispersion p-type buffer layer (31) is provided on the InP semiconductor substrate (1) that is a compound semiconductor substrate, so that the current corresponding to the photocarriers reaching the p-type light absorption layer (3) does not easily concentrate at one location. In this manner, it becomes possible to form a device having the initial characteristics which are not degraded by a light input of approximately 10 mW when the multiplication factor M is small.

Example 2 of Second Exemplary Embodiment

Referring now to FIG. 6, a second example structure of the semiconductor light receiving device of the second exemplary embodiment is described.

As shown in FIG. 6, the semiconductor light receiving device of the second exemplary embodiment includes the stack structure formed on the InP semiconductor substrate (1). The stack structure includes the p-InP buffer layer (2), the current dispersion p-type buffer layer (31), the crystalline quality recovery layer (32), the p-type light absorption layer (3), the i-type light absorption layer (4), the electric field relaxation layer (5), the multiplier layer (6), the etching stop layer (7), the n-type buffer layer (8), and the n-type contact layer (9) stacked in this order. The n-type contact layer (9) and the n-type buffer layer (8) are removed around the light receiving part until the removal reaches the etching stop layer (7). Ti ions are then implanted to form the guard ring (11). After a dielectric film is formed, Zn diffusion is caused in the neighboring area of the guard ring (11) to form the Zn diffusion layer (10). The p-type electrode (13) is formed on the Zn diffusion layer (10). The n-type electrode (12) is formed on the n-type contact layer (9). The incident face at the lower portion of the InP semiconductor substrate (1) is coated with an AR (Anti-Reflection) coating.

The p-InP buffer layer (2) has a layer thickness d of 0.5 µm, and p-concentration Nd of $5.0 \times 10^{17}$ cm$^{-3}$.

The current dispersion p-type buffer layer (31) is formed as a concentration gradient layer that includes the composition of InAlGaAs, has a layer thickness d of 1 µm, has p-concentration Na of $1 \times 10^{18}$ cm$^{-3}$ in the lowermost face of the concentration gradient layer. If the device light receiving diameter is 30 µm, and the distance G1 in the radial direction of the isolation groove is 5 µm, the following equation is established: $L0 = 15 + 5 = 20$ µm.

To have the same effect as above in the area approximately 1 µm from the light receiving part, since the following equation is established: $R1(5+1) = 6/(6+2) = 0.75$, so that the concentration Nb is set to $7.5 \times 10^{17}$ cm$^{-3}$.

The crystalline quality recovery layer (32) includes a composition of p-InP, has a layer thickness d of 50 nm, and has concentration Nd of $5 \times 10^{17}$ cm$^{-3}$.

The light absorption layers (3, 4) each include a composition of InGaAs, and have a layer thickness of 1.5 µm.

As shown in FIG. 6, in the semiconductor light receiving device of the second exemplary embodiment, the current dispersion p-type buffer layer (31) is provided on the InP semiconductor substrate (1) that is a compound semiconductor substrate, so that the current corresponding to the photocarriers reaching the p-type light absorption layer (3) does not easily concentrate at one location. In this manner, it becomes possible to form a device having the initial characteristics which are not degraded by a light input of approximately 10 mW when the multiplication factor M is small.

With the crystalline quality recovery layer (32), the semiconductor light receiving device of the second exemplary embodiment can realize a device that has a low dark current and high sensitivity formed along the inner plane of a wafer at a high yield.

It should be noted that the above exemplary embodiments are preferred exemplary embodiments of the present invention, and the present invention is not limited to those exemplary embodiments. Various changes and modifications may be made to those exemplary embodiments without departing from the scope of the present invention.

EXPLANATION OF REFERENCE NUMERALS

1 InP semiconductor substrate
2 p-InP buffer layer
3 p-type light absorption layer
4 i-type light absorption layer
5 electric field relaxation layer
6 multiplier layer
7 etching stop layer 8 n-type buffer layer
9 n-type contact layer
10 Zn diffusion layer
11 guard ring
12 n-type electrode
13 p-type electrode
21 p-type quaternary buffer layer (quaternary buffer layer)
22 crystalline quality recovery layer
31 current dispersion p-type buffer layer (current dispersion layer)
32 crystalline quality recovery layer

The invention claimed is:

1. A semiconductor light receiving device, including:
   an InP semiconductor substrate;
   a light absorption layer that is formed on the InP semiconductor substrate;
   a multiplier layer that is formed on the light absorption layer;
   a guard ring that is formed in a region including the multiplier layer; a buffer layer that contains a quaternary compositional material is formed between the InP semiconductor substrate and the light absorption layer; and
   a crystalline quality recovery layer for dividing a connection layer formed with a connection between a ternary layer made of a ternary compositional material and a quaternary layer made of a quaternary compositional material.

2. The semiconductor light receiving device according to claim 1, wherein the quaternary buffer layer contains composition of InxAlyGa(1-x-y)As or InxGa(1-x)AsyP(1-y), which exhibits lattice matching with InP.

3. The semiconductor light receiving device according to claim 1, wherein a layer thickness of the quaternary buffer layer is 0.5 µm or greater.

4. The semiconductor light receiving device according to claim 1, wherein a layer thickness of the quaternary buffer layer is 1.5 µm or smaller.

5. The semiconductor light receiving device according to claim 1, wherein bandgap energy Eg(Q) of the quaternary buffer layer satisfies a relational expression: Eg(InP)>Eg(Q)>Eλ (where Eg(InP) represents bandgap energy of the InP semiconductor substrate, and Eλ represents an energy equivalent to wavelength of a signal light to be received).

6. The semiconductor light receiving device according to claim 1, wherein the crystalline quality recovery layer is formed between the light absorption layer and the quaternary buffer layer, or in the light absorption layer, or in the quaternary buffer layer.

7. The semiconductor light receiving device according to claim 1, wherein the crystalline quality recovery layer is formed between the light absorption layer and a current dispersion layer, or in the light absorption layer, or in a current dispersion layer.

8. The semiconductor light receiving device according to claim 1, wherein the crystalline quality recovery layer contains a binary compositional material.

9. The semiconductor light receiving device according to claim 1, wherein the crystalline quality recovery layer has a layer thickness within the range of 10 nm to 100 nm.

10. The semiconductor light receiving device according to claim 1, wherein the crystalline quality recovery layer has concentration equal to or higher than concentration in a layer in contact with the upper portion of the crystalline quality recovery layer, or has concentration equal to or lower than concentration in a layer in contact with the lower portion of the crystalline quality recovery layer.

11. The semiconductor light receiving device according to claim 1, wherein the width between the uppermost end of the light absorption layer and the uppermost end of the crystalline quality recovery layer is 1.5 µm or smaller.

12. A semiconductor light receiving device, including:
    an InP semiconductor substrate;
    a light absorption layer that is formed on the InP semiconductor substrate;
    a multiplier layer that is formed on the light absorption layer;
    a guard ring that is formed in a region including the multiplier layer;
    a current dispersion layer that disperses a current distribution is formed between the InP semiconductor substrate and the light absorption layer; and
    a crystalline quality recovery layer for dividing a connection layer formed with a connection between a ternary layer made of a ternary compositional material and a quaternary layer made of a quaternary compositional material.

13. The semiconductor light receiving device according to claim 12, wherein the current dispersion layer includes an impurity concentration gradient structure.

14. The semiconductor light receiving device according to claim 13, wherein the concentration gradient structure has high concentration on a side of the InP semiconductor substrate, and has low concentration on a side of the light absorption layer.

15. The semiconductor light receiving device according to claim 13, wherein the concentration gradient structure has a ratio R2 (Nb/Na) between concentration Na in the lowermost face of the concentration gradient and concentration Nb in the uppermost face of the concentration gradient within a range defined by $1>R2>R1(G1)\times 0.1$ (where d represents a layer thickness of the concentration gradient structure, G1 represents a guard ring width, and R1(G1) is equal to $G1/(G1+2d)$).

16. The semiconductor light receiving device according to claim 13, wherein the concentration gradient structure has a ratio R2(Nb/Na) between the concentration Na in the lowermost face of the concentration gradient and the concentration Nb in the uppermost face of the concentration gradient within a range defined by $R2=R1(G1)$ (where d represents the layer thickness of the concentration gradient structure, G1 represents the guard ring width, and R1(G1) is equal to $G1/(G1+2d)$).

17. The semiconductor light receiving device according to claim 12, wherein the current dispersion layer contains composition of InxAlyGa(1-x-y)As or InxGa(1-x)AsyP(1-y), which exhibits lattice matching with InP.

18. The semiconductor light receiving device according to claim 12, wherein bandgap energy Eg(Q) of the current dispersion layer satisfies a relational expression: Eg(InP)>Eg(Q)>Eλ (where Eg(InP) represents bandgap energy of the InP semiconductor substrate, and Eλ represents energy equivalent to wavelength of a signal light to be received).

19. The semiconductor light receiving device according to claim 12, wherein the layer thickness of the current dispersion layer is 1.5 µm or smaller.

* * * * *